United States Patent
Horak et al.

(10) Patent No.: US 8,828,876 B2
(45) Date of Patent: Sep. 9, 2014

(54) DUAL MANDREL SIDEWALL IMAGE TRANSFER PROCESSES

(71) Applicant: International Business Machines Corporation, Armonk, NY (US)

(72) Inventors: David V. Horak, Essex Junction, VT (US); Charles W. Koburger, III, Delmar, NY (US); Shom Ponoth, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/737,099

(22) Filed: Jan. 9, 2013

(65) Prior Publication Data

US 2014/0190935 A1    Jul. 10, 2014

(51) Int. Cl.
*H01L 21/311* (2006.01)
*C23F 1/04* (2006.01)

(52) U.S. Cl.
CPC ........................................ *C23F 1/04* (2013.01)
USPC ................ 438/696; 438/700; 216/41; 216/46

(58) Field of Classification Search
USPC ........................................ 438/696; 216/41, 46
See application file for complete search history.

(56) References Cited

U.S. PATENT DOCUMENTS

| 6,875,703 | B1 | 4/2005 | Furukawa et al. |
|---|---|---|---|
| 7,935,998 | B2 | 5/2011 | Cheng et al. |
| 8,026,044 | B2 | 9/2011 | Lee et al. |
| 8,026,179 | B2 | 9/2011 | Lue |
| 2009/0001470 | A1 | 1/2009 | Anderson et al. |
| 2009/0004867 | A1* | 1/2009 | Yune .............................. 438/696 |
| 2010/0120247 | A1* | 5/2010 | Park .............................. 438/691 |
| 2010/0167548 | A1 | 7/2010 | Kim |
| 2011/0014786 | A1 | 1/2011 | Sezginer et al. |
| 2011/0113393 | A1 | 5/2011 | Sezginer |
| 2012/0124528 | A1 | 5/2012 | Wang et al. |

OTHER PUBLICATIONS

Bencher, C., "An Assessment of Patterning Options for 15nm Half-Pitch" 2011 International Symposium on VLSI Technology, Systems and Applications (VLSI-TSA) (Apr. 25-27, 2011) 2 pages.

Mirsaeedi, M. et al., "Self-Aligned Double Patterning (SADP) Layout Decomposition" 12th International Symposium on Quality Electronic Design (ISQED) (Mar. 14-16, 2011) pp. 103-109.

Zhang, H. et al., "Characterization and Decomposition of Self-Aligned Quadruple Patterning Friendly Layout" Proceedings of SPIE, Optical Microlithography XXV (Feb. 13-16, 2012) 83260E-1-83260E-11, vol. 8326.

* cited by examiner

*Primary Examiner* — Roberts Culbert

(74) *Attorney, Agent, or Firm* — Scully, Scott, Murphy & Presser, P.C.; H. Daniel Schnurmann

(57) ABSTRACT

A combination of two lithographically patterned mandrels can be employed in conjunction with sidewall spacers to provide two spacers. The two spacers may intersect each other and/or contact sidewall surfaces of each other to provide a thickness that is a sum of the thicknesses of the two spacers. Further, the two spacers may be patterned to provide various patterns. In addition, portions of at least one of the two spacers may be etched employing an etch mask. Additionally or alternately, an additional material may be selectively added to portions of one of the two spacers.

19 Claims, 15 Drawing Sheets

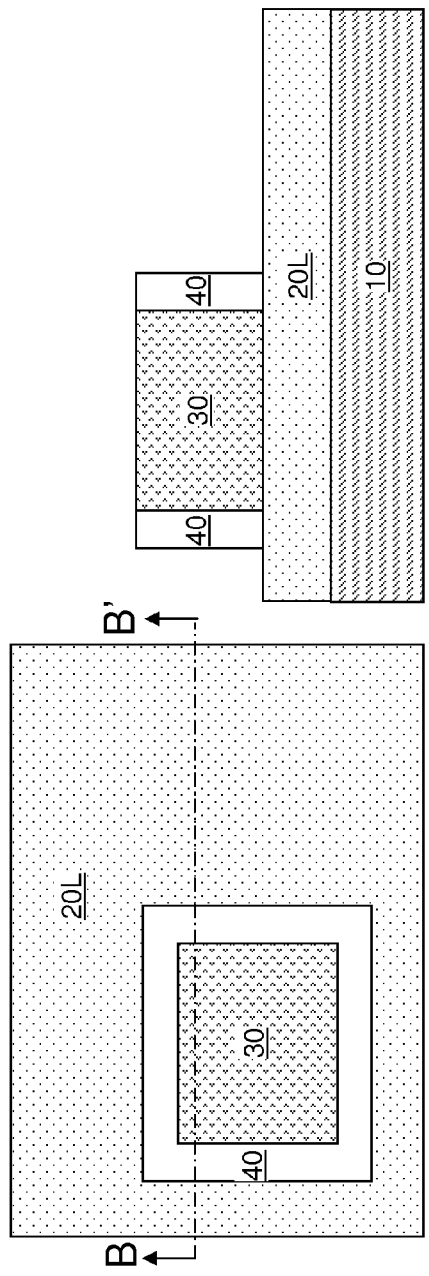
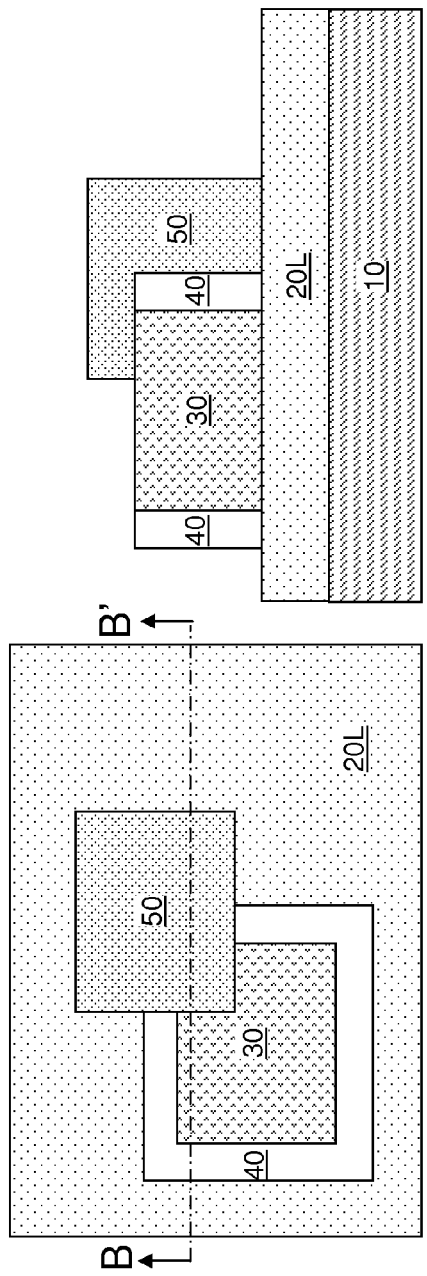
FIG. 1A
FIG. 1B
FIG. 2A
FIG. 2B

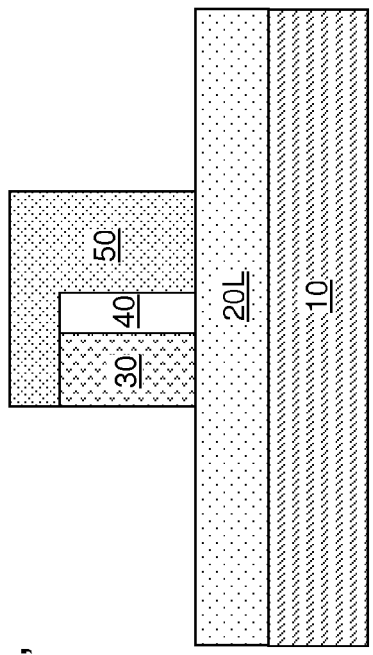 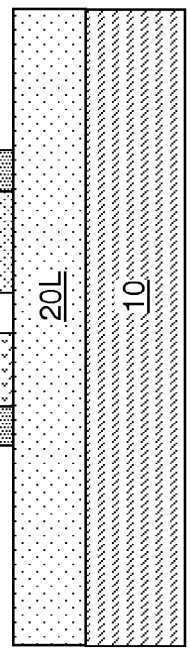
FIG. 3B    FIG. 4B
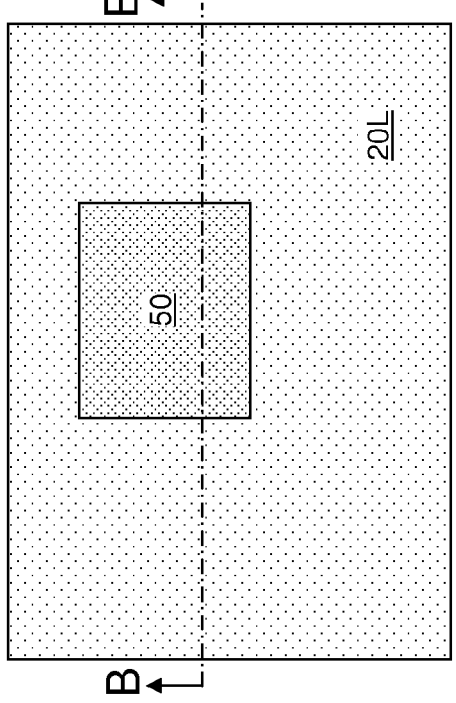 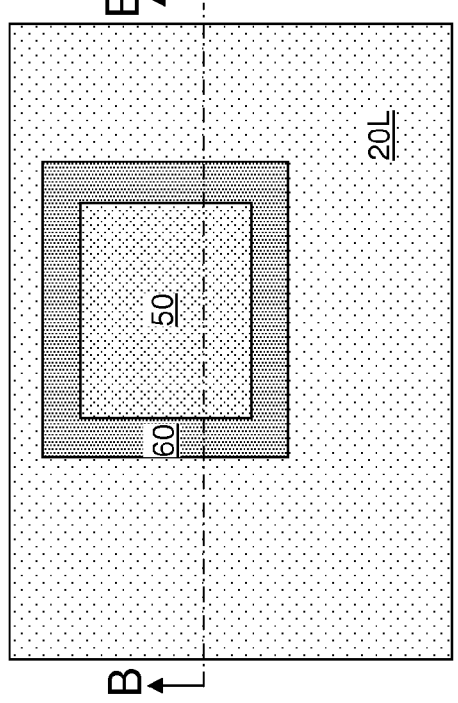
FIG. 3A    FIG. 4A

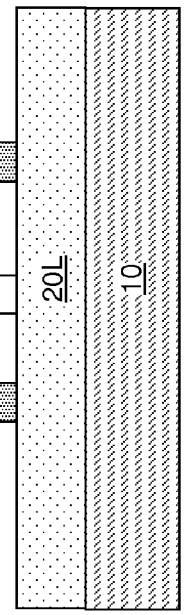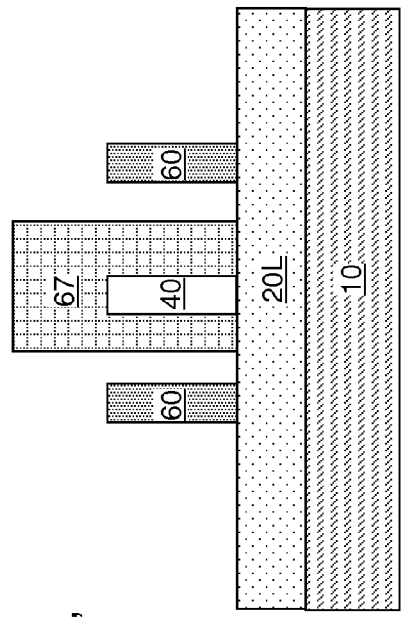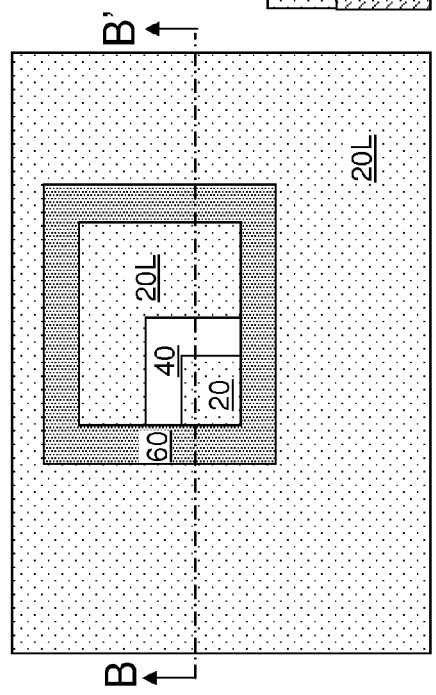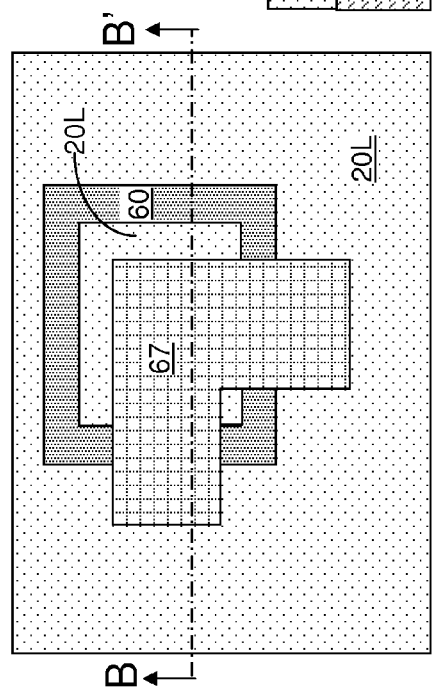

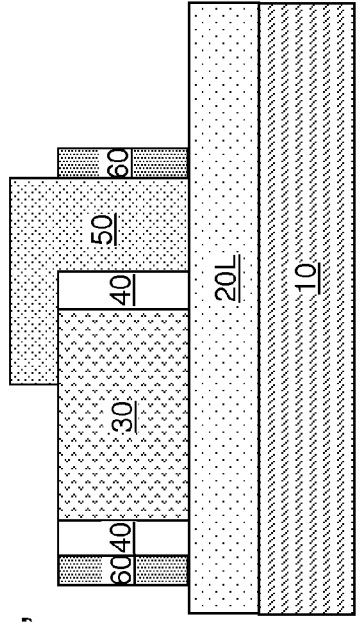
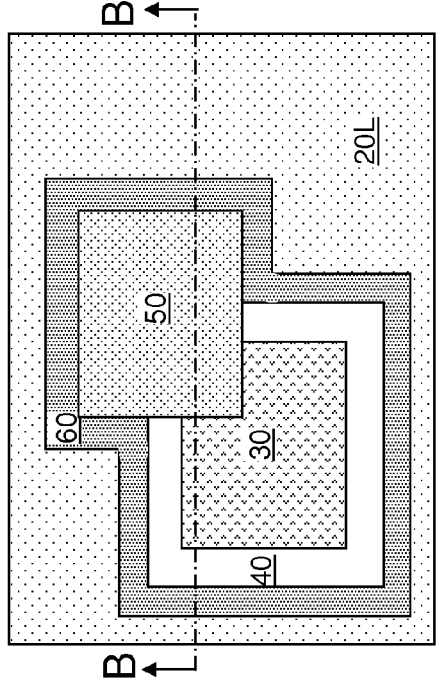
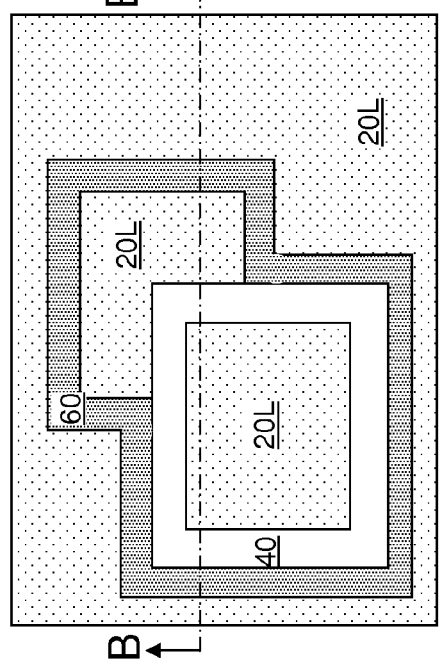
FIG. 9A
FIG. 9B
FIG. 10A
FIG. 10B

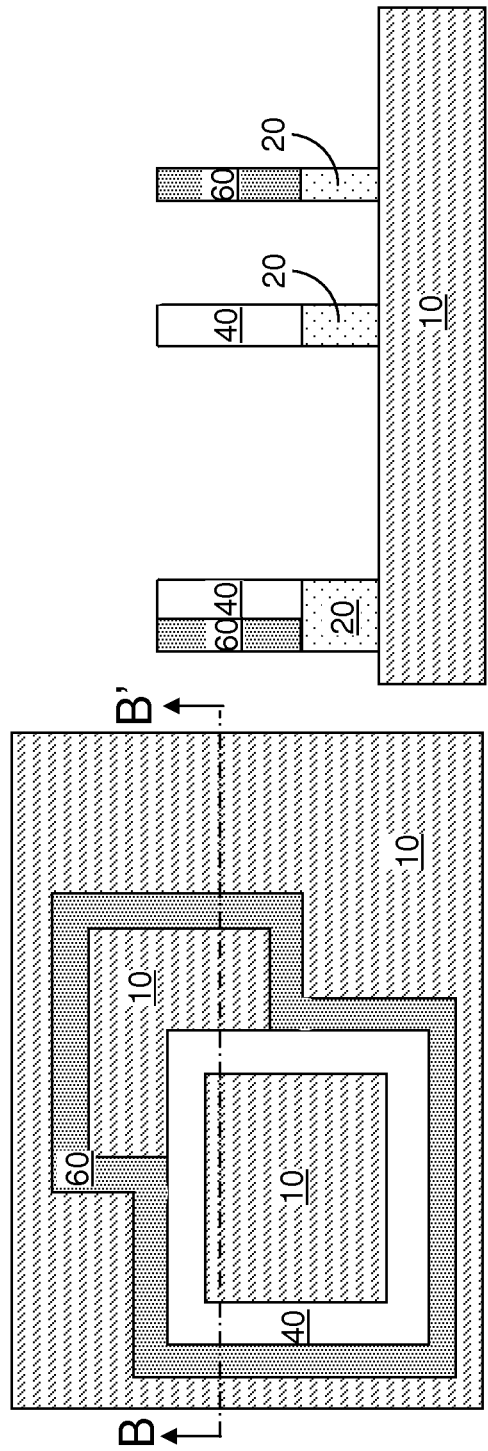

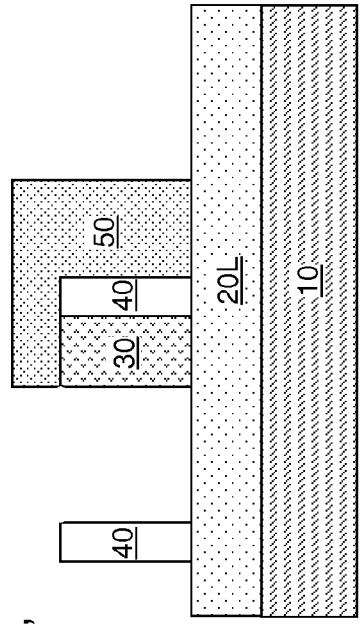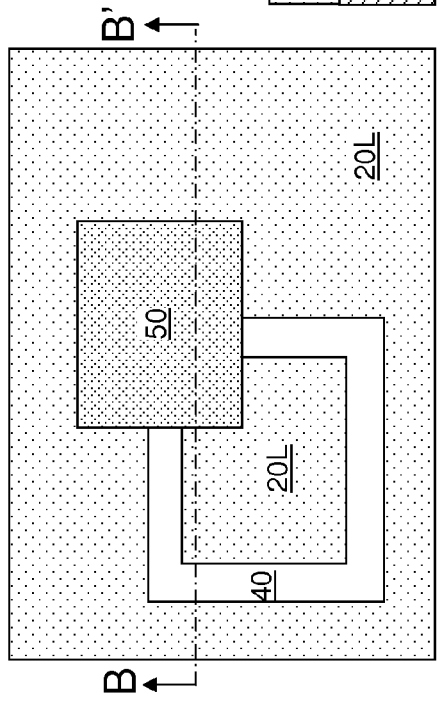
FIG. 12A  FIG. 12B
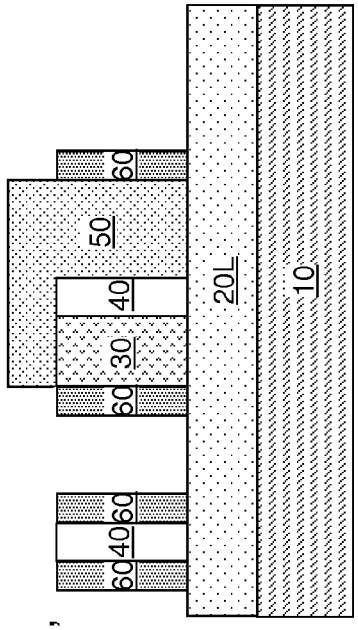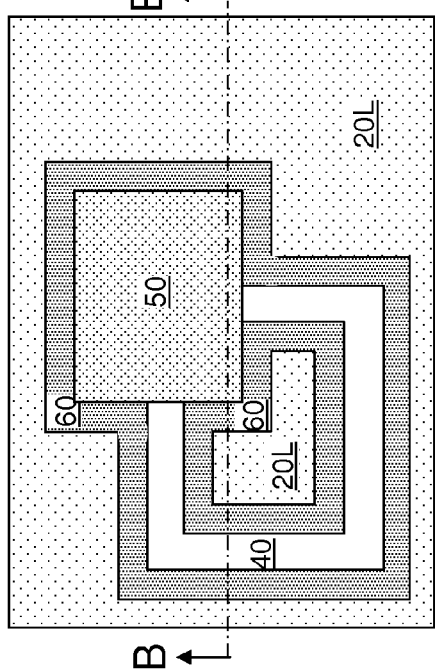
FIG. 13A  FIG. 13B

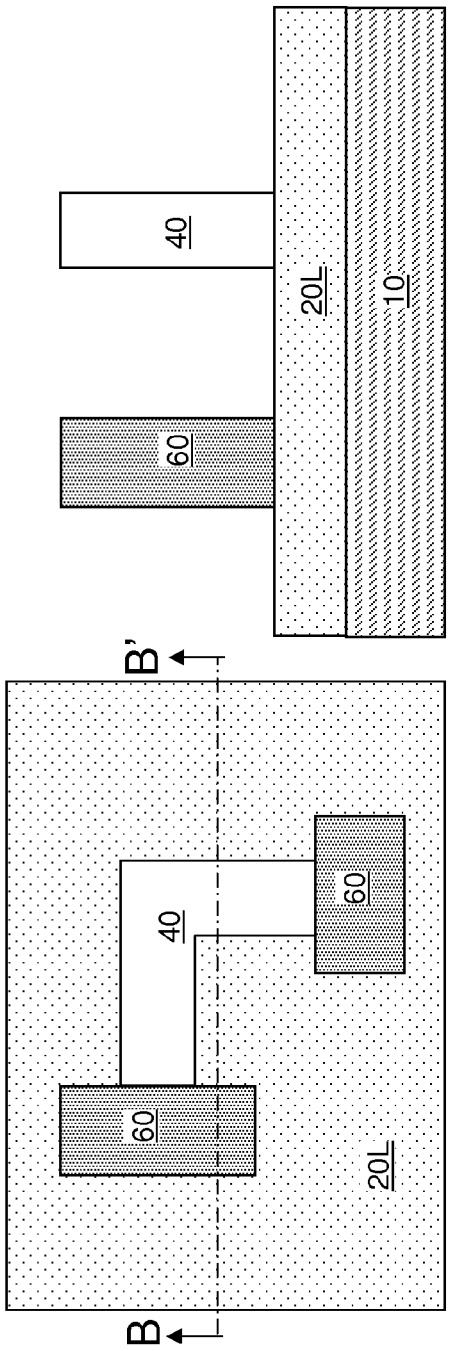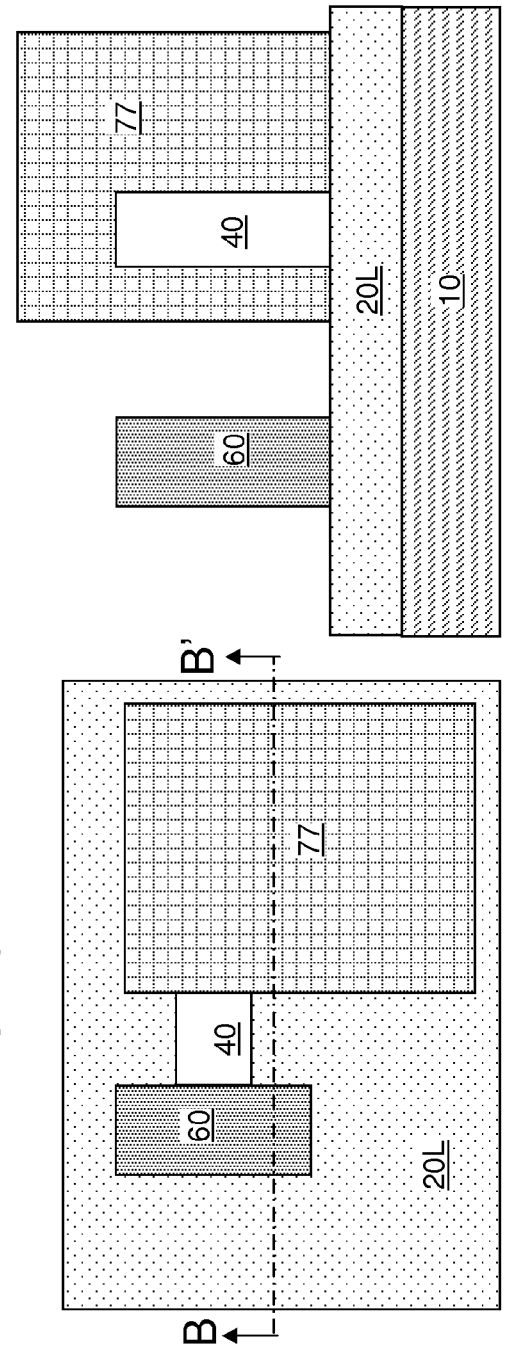

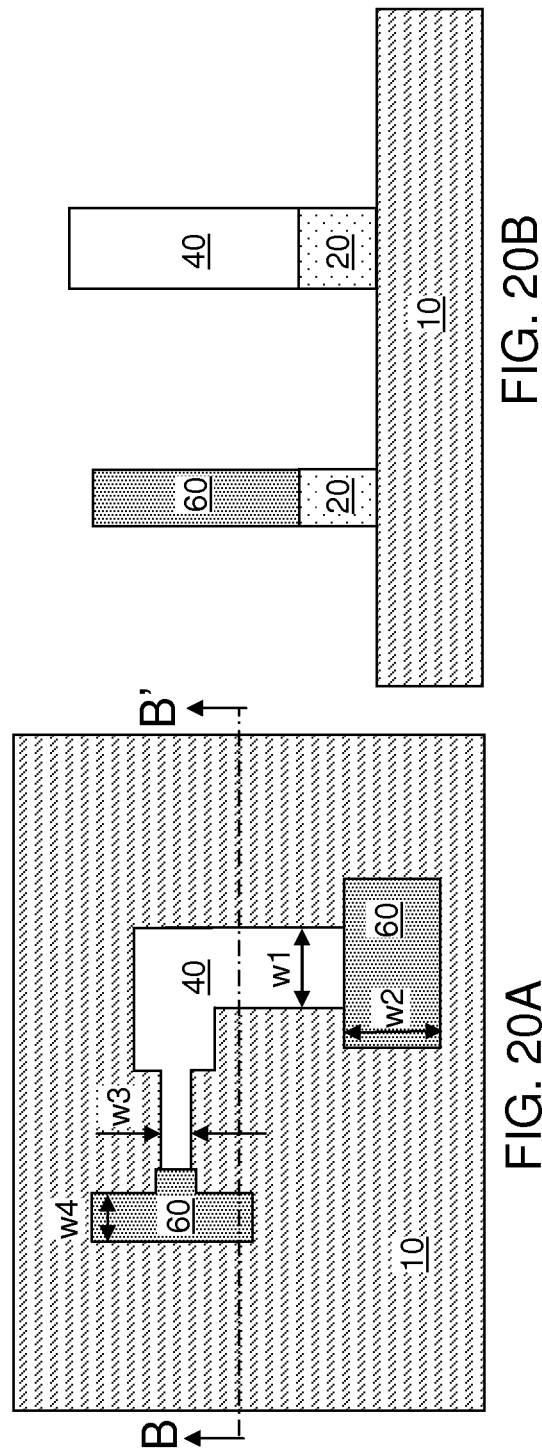

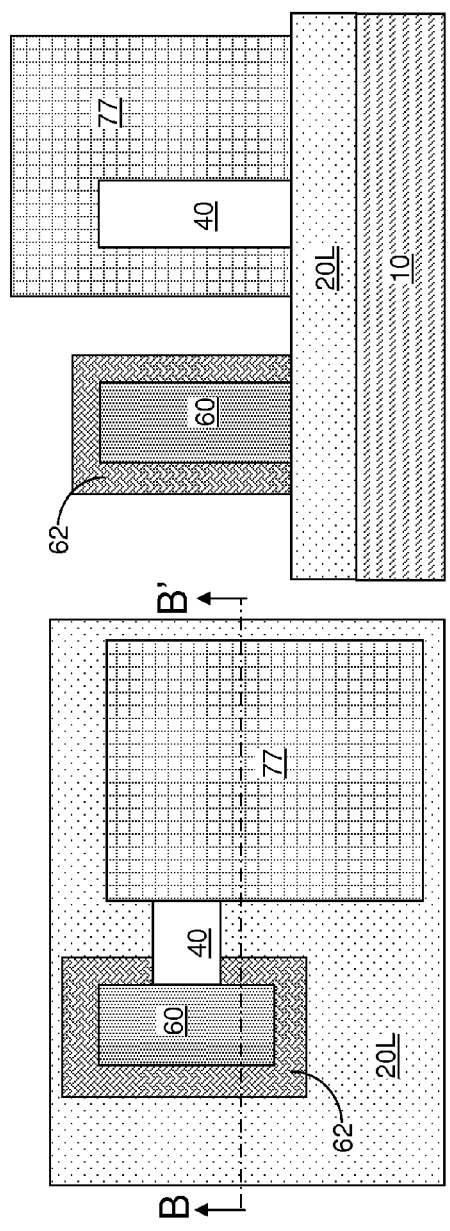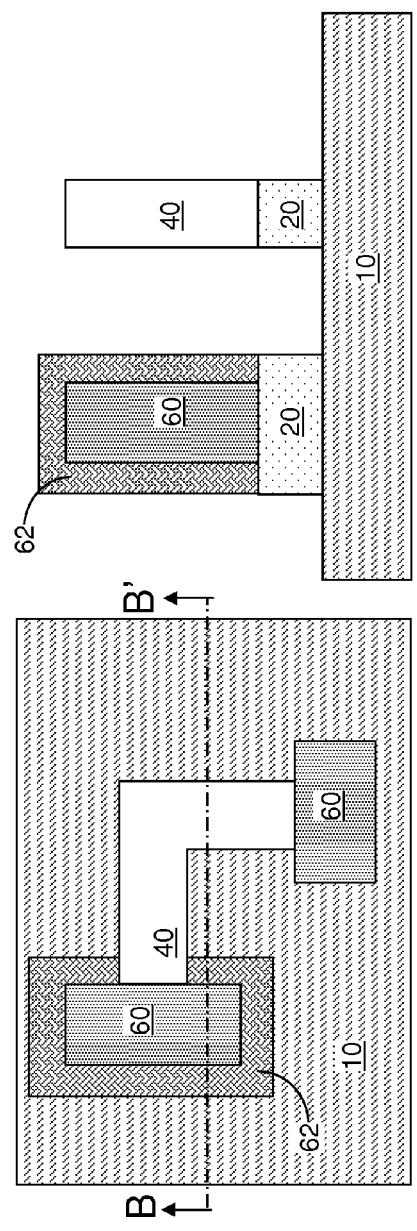
FIG. 21A  FIG. 21B  FIG. 22A  FIG. 22B

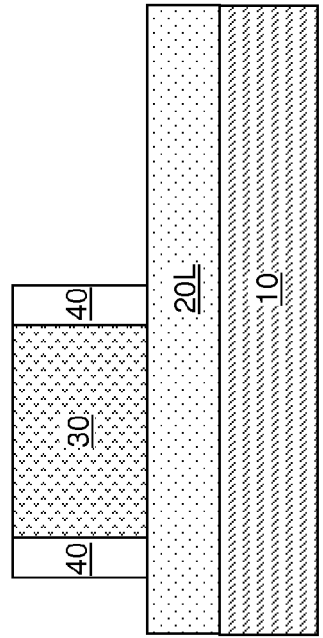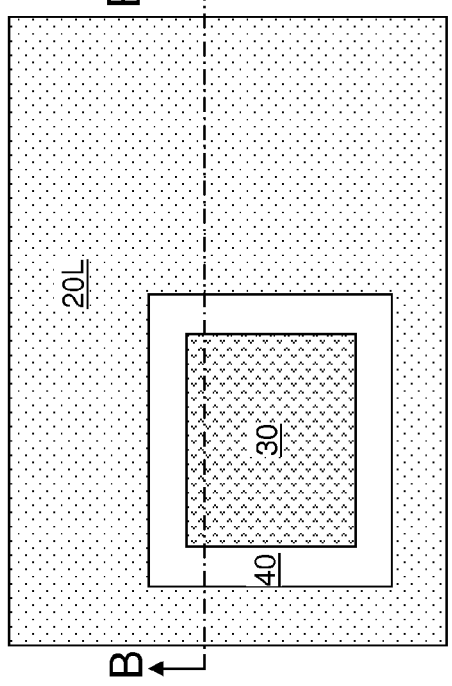
FIG. 23A
FIG. 23B
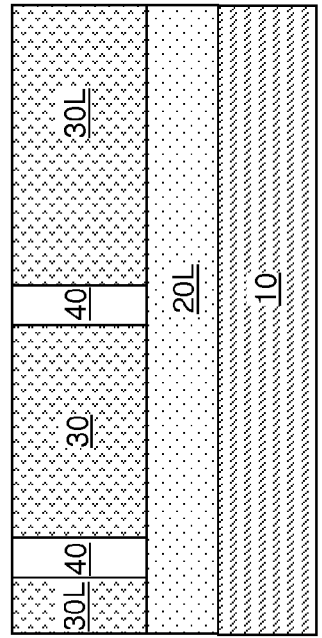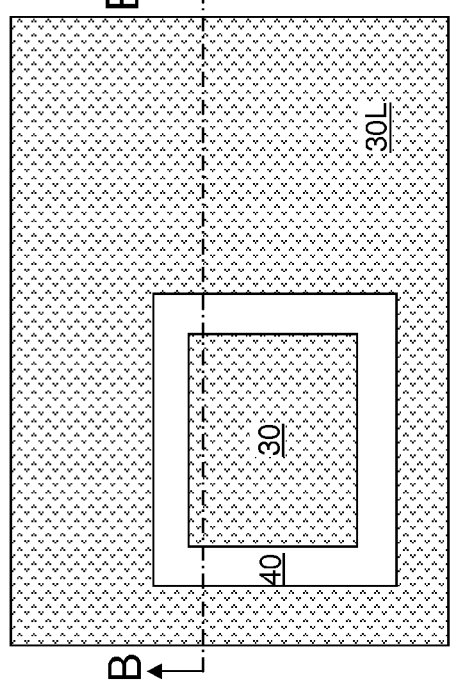
FIG. 24A
FIG. 24B

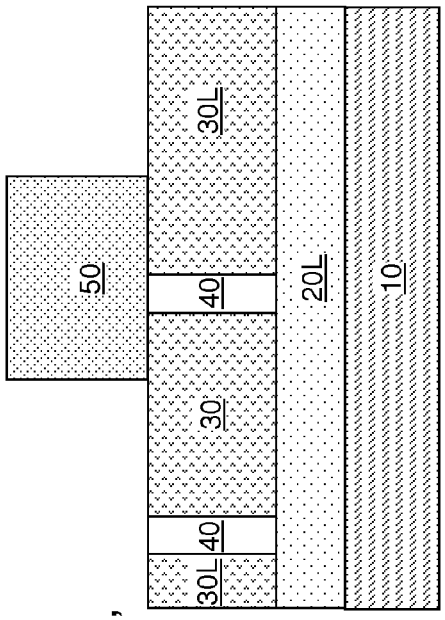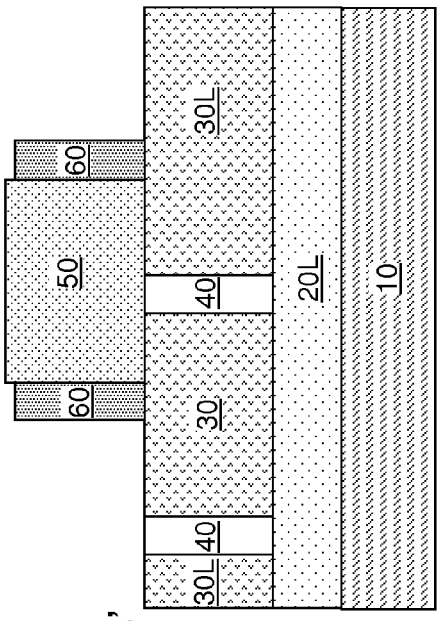
FIG. 25A  FIG. 25B
FIG. 26A  FIG. 26B

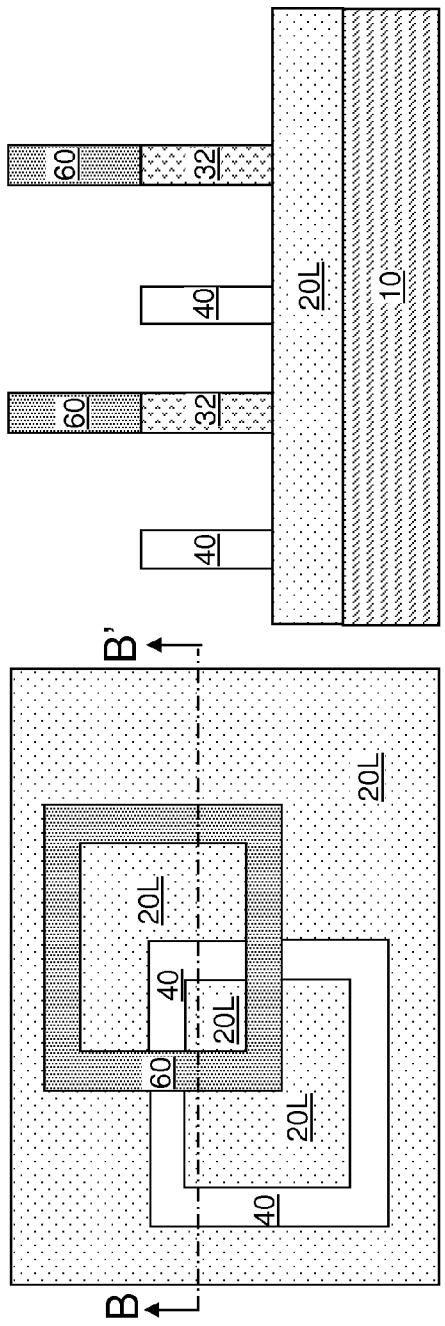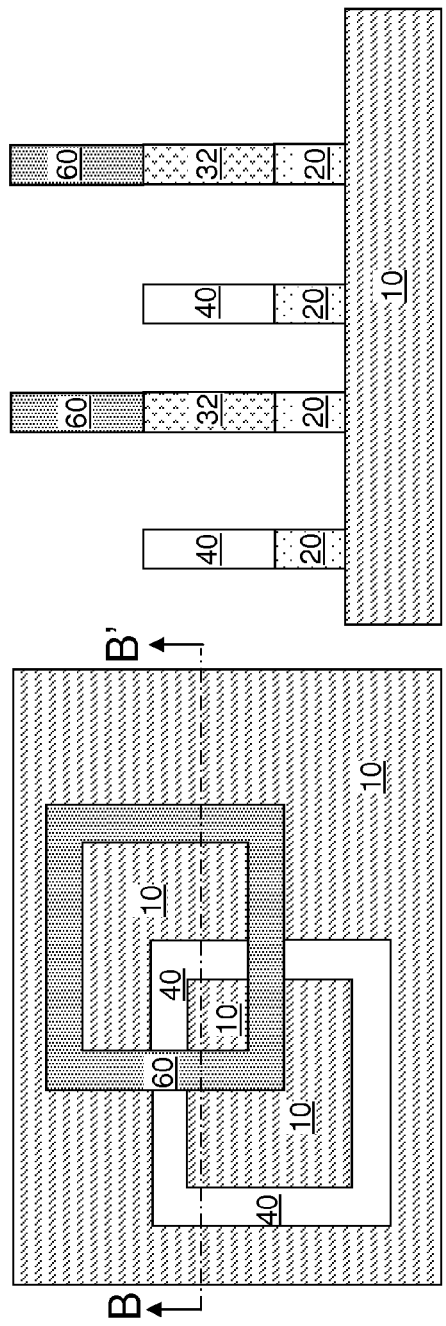

US 8,828,876 B2

DUAL MANDREL SIDEWALL IMAGE TRANSFER PROCESSES

BACKGROUND

The present disclosure relates to a method of forming patterned structures, and particularly to a method of forming patterned structures employing dual mandrel sidewall image transfer processes.

As scaling of lithographically printable dimensions stagnates due to delays in development of lithographic exposure tools for printing small scale images, methods of forming small dimensions in a manner not limited by lithographic capabilities are desired in semiconductor manufacturing. Particularly, methods of patterning a material layer with a complex and arbitrary pattern are desired.

SUMMARY

A combination of two lithographically patterned mandrels can be employed in conjunction with sidewall spacers to provide two spacers. The two spacers may intersect each other and/or contact sidewall surfaces of each other to provide a thickness that is a sum of the thicknesses of the two spacers. Further, the two spacers may be patterned to provide various patterns. In addition, portions of at least one of the two spacers may be etched employing an etch mask. Additionally or alternately, an additional material may be selectively added to portions of one of the two spacers.

According to an aspect of the present disclosure, a method of forming a patterned structure is provided. A first mandrel structure is formed on a top surface of a material layer. A first spacer is formed around the first mandrel structure. A second mandrel structure that straddles a portion of the first spacer is then formed. A second spacer is formed around the second mandrel structure. A composite pattern of at least one portion of the first spacer and at least one portion of the second spacer is transferred into the material layer by an etch.

BRIEF DESCRIPTION OF SEVERAL VIEWS OF THE DRAWINGS

FIG. 1A is a top-down view of a first exemplary structure after formation of a first mandrel structure and a first spacer according to an embodiment of the present disclosure.

FIG. 1B is a vertical cross-sectional view of the first exemplary structure along the vertical plane B-B' of FIG. 1A.

FIG. 2A is a top-down view of the first exemplary structure after formation of a second mandrel structure according to an embodiment of the present disclosure.

FIG. 2B is a vertical cross-sectional view of the first exemplary structure along the vertical plane B-B' of FIG. 2A.

FIG. 3A is a top-down view of the first exemplary structure after removal of physically exposed portions of the first mandrel structure and the first spacer employing the second mandrel structure as an etch mask according to an embodiment of the present disclosure.

FIG. 3B is a vertical cross-sectional view of the first exemplary structure along the vertical plane B-B' of FIG. 3A.

FIG. 4A is a top-down view of the first exemplary structure after formation of a second spacer according to an embodiment of the present disclosure.

FIG. 4B is a vertical cross-sectional view of the first exemplary structure along the vertical plane B-B' of FIG. 4A.

FIG. 5A is a top-down view of the first exemplary structure after removal of the second mandrel structure according to an embodiment of the present disclosure.

FIG. 5B is a vertical cross-sectional view of the first exemplary structure along the vertical plane B-B' of FIG. 5A.

FIG. 6A is a top-down view of the first exemplary structure after formation of a masking material layer according to an embodiment of the present disclosure.

FIG. 6B is a vertical cross-sectional view of the first exemplary structure along the vertical plane B-B' of FIG. 6A.

FIG. 9A is a top-down view of a second exemplary structure after formation of a second spacer according to an embodiment of the present disclosure.

FIG. 9B is a vertical cross-sectional view of the second exemplary structure along the vertical plane B-B' of FIG. 9A.

FIG. 10A is a top-down view of the second exemplary structure after removal of the first and second mandrel structures according to an embodiment of the present disclosure.

FIG. 10B is a vertical cross-sectional view of the second exemplary structure along the vertical plane B-B' of FIG. 10A.

FIG. 11A is a top-down view of the second exemplary structure after transfer of the pattern in remaining portions of the first and second spacers into an underlying material layer according to an embodiment of the present disclosure.

FIG. 11B is a vertical cross-sectional view of the second exemplary structure along the vertical plane B-B' of FIG. 11A.

FIG. 12A is a top-down view of a third exemplary structure after removal of the first mandrel structure selective to the second mandrel structure according to an embodiment of the present disclosure.

FIG. 12B is a vertical cross-sectional view of the third exemplary structure along the vertical plane B-B' of FIG. 12A.

FIG. 13A is a top-down view of the third exemplary structure after formation of a second spacer according to an embodiment of the present disclosure.

FIG. 13B is a vertical cross-sectional view of the third exemplary structure along the vertical plane B-B' of FIG. 13A.

FIG. 16A is a top-down view of a fourth exemplary structure after patterning first and second spacers according to an embodiment of the present disclosure.

FIG. 16B is a vertical cross-sectional view of the fourth exemplary structure along the vertical plane B-B' of FIG. 16A.

FIG. 17A is a top-down view of the fourth exemplary structure after forming a masking material layer according to an embodiment of the present disclosure.

FIG. 17B is a vertical cross-sectional view of the fourth exemplary structure along the vertical plane B-B' of FIG. 17A.

FIG. 20A is a top-down view of the fourth exemplary structure after transfer of the pattern in remaining portions of the first and second spacers into an underlying material layer according to an embodiment of the present disclosure.

FIG. 20B is a vertical cross-sectional view of the fourth exemplary structure along the vertical plane B-B' of FIG. 20A.

FIG. 21A is a top-down view of a fifth exemplary structure after selective deposition of a material on physically exposed portions of the second spacer according to an embodiment of the present disclosure.

FIG. 21B is a vertical cross-sectional view of the fifth exemplary structure along the vertical plane B-B' of FIG. 21A.

FIG. 22A is a top-down view of the fifth exemplary structure after transfer of the pattern in remaining portions of the first and second spacers into an underlying material layer according to an embodiment of the present disclosure.

FIG. 22B is a vertical cross-sectional view of the fifth exemplary structure along the vertical plane B-B' of FIG. 22A.

FIG. 23A is a top-down view of a sixth exemplary structure after formation of a first mandrel structure and a first spacer according to an embodiment of the present disclosure.

FIG. 23B is a vertical cross-sectional view of the sixth exemplary structure along the vertical plane B-B' of FIG. 23A.

FIG. 24A is a top-down view of the sixth exemplary structure after formation of a matrix layer that complementarily fills an entire space above the underlying material layer up to the top surface of the first spacer according to an embodiment of the present disclosure.

FIG. 24B is a vertical cross-sectional view of the sixth exemplary structure along the vertical plane B-B' of FIG. 24B.

FIG. 25A is a top-down view of the sixth exemplary structure after formation of a second mandrel structure according to an embodiment of the present disclosure.

FIG. 25B is a vertical cross-sectional view of the sixth exemplary structure along the vertical plane B-B' of FIG. 25A.

FIG. 26A is a top-down view of the sixth exemplary structure after formation of a second spacer around the second mandrel structure according to an embodiment of the present disclosure.

FIG. 26B is a vertical cross-sectional view of the sixth exemplary structure along the vertical plane B-B' of FIG. 26A.

FIG. 27A is a top-down view of the sixth exemplary structure after etching of the second mandrel structure, the first mandrel structure, and the matrix layer employing the second spacer as an etch mask according to an embodiment of the present disclosure.

FIG. 27B is a vertical cross-sectional view of the sixth exemplary structure along the vertical plane B-B' of FIG. 27A.

FIG. 28A is a top-down view of the sixth exemplary structure after transfer of the pattern in the first and second spacers into the underlying material layer according to an embodiment of the present disclosure.

FIG. 28B is a vertical cross-sectional view of the sixth exemplary structure along the vertical plane B-B' of FIG. 28A.

DETAILED DESCRIPTION

Figure 7A:
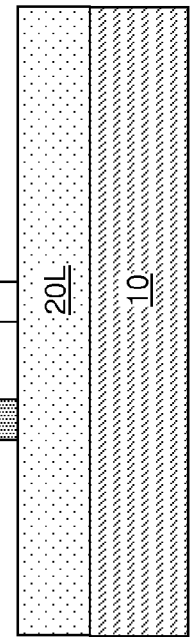
FIG. 7A is a top-down view of the first exemplary structure after etching physically exposed portions of the first and second spacers and removal of the masking material layer according to an embodiment of the present disclosure.

As stated above, the present disclosure relates to methods of forming patterned structures employing dual mandrel sidewall image transfer processes. Aspects of the present disclosure are now described in detail with accompanying figures. It is noted that like reference numerals refer to like elements across different embodiments. Elements with the same reference numerals have the same composition across different embodiments unless expressly indicated otherwise. The drawings are not necessarily drawn to scale.

Referring to FIGS. 1A and 1B, a first exemplary according to an embodiment of the present disclosure includes a material layer 20L. The material layer 20L can include any material provided that the material layer 20L includes a material that is different from the materials of various structures to be subsequently formed thereupon. The material layer 20L can be a semiconductor material layer, a dielectric material layer, or a conductive material layer. The material layer 20L can have a planar top surface. In one embodiment, the material layer 20L can be provided on a substrate 10, which can include a semiconductor material, a dielectric material, and/or a conductive material. The material layer 20L is an optional structure, and as such, variations in which the material layer 20L is omitted from the various illustrated structures herein are expressly contemplated.

A first mandrel structure 30 is formed on the top surface of the material layer 20L, or, if the material layer 20L is not present, on the top surface of the substrate 10. The first mandrel structure 30 can be formed, for example, by depositing a first mandrel material layer (not shown) and patterning the first mandrel material layer, for example, by a combination of lithographic methods and an etch, which can be an anisotropic etch or an isotropic etch. The composition of the first mandrel structure 30 may be the same as, or may be different from, the composition of the material layer 20.

The first mandrel structure 30 can include a semiconductor material, a dielectric material, or a conductive material, provided that the material of the first mandrel structure 30 is different from the material of the material layer 20L. In one embodiment, the first mandrel structure 30 can include silicon, a silicon-germanium alloy, germanium, amorphous carbon, silicon oxide, silicon oxynitride, silicon nitride, a dielectric metal oxide, a dielectric metal nitride, a photoresist material, an organic material, an elemental metal, an intermetallic alloy, a metal oxide, a metal nitride, or any other material different from the material of the material layer 20L. The height of the first mandrel structure 30 can be, for example, from 10 nm to 500 nm, although lesser and greater thicknesses can also be employed.

A first spacer 40 is formed around the first mandrel structure 30. The first spacer 40 can be formed by depositing a first spacer material layer (not shown) on the top surface of the material layer 20L and on the top surface and sidewalls of the first mandrel structure 30, and removing horizontal portions of the first spacer material layer by an anisotropic etch, such as a reactive ion etch. The remaining vertical portions of the first spacer material layer constitute the first spacer 40.

The first spacer 40 can include a semiconductor material, a dielectric material, or a conductive material, provided that the material of the first spacer 40 is different from the material of the first mandrel structure 30 and from the material of the material layer 20L. In one embodiment, the first spacer 40 can include silicon, a silicon-germanium alloy, germanium, amorphous carbon, silicon oxide, silicon oxynitride, silicon nitride, a dielectric metal oxide, a dielectric metal nitride, an organic material, an elemental metal, an intermetallic alloy, a metal oxide, a metal nitride, or any other material different from the material of the material layer 20L and from the material of the first mandrel structure 30. In an illustrative example, the first mandrel structure 30 can include germanium, silicon-germanium alloy, or amorphous carbon, and the first spacer 40 can include silicon oxide, silicon nitride, or silicon oxynitride.

The thickness of the first spacer 40, i.e., the lateral dimension between an inner sidewall of the first spacer 40 and an outer sidewall that is most proximate to the inner sidewall, is not limited by lithographic capabilities of available lithography tools. Thus, the thickness of the first spacer 40 can be a sublithographic dimension, i.e., a dimension that is less than the smallest dimension that can be printed by single lithographic exposure. In one embodiment, the thickness of the first spacer 40 can be from 1 nm to 100 nm, although lesser and greater thicknesses can also be employed. In one embodiment, the aspect ratio of the first spacer 40, i.e., the ratio of the height of the first spacer 40 to the thickness of the first spacer 40, can be in a range from 2.5 to 100.

Referring to FIGS. 2A and 2B, a second mandrel structure 50 is formed on the top surface of the material layer 20L. The second mandrel structure 50 can be formed, for example, by depositing a second mandrel material layer (not shown) and patterning the second mandrel material layer, for example, by a combination of lithographic methods and an etch, which can be an anisotropic etch or an isotropic etch. The second mandrel structure 50 straddles a portion of the first spacer 40. A portion of the first mandrel structure 30 can be covered with the second mandrel structure 50.

The second mandrel structure 50 can include a semiconductor material, a dielectric material, or a conductive material, provided that the material of the second mandrel structure 50 is different from the material of the material layer 20L, the material of the first mandrel structure 30, and the material of the first spacer 40. In one embodiment, the second mandrel structure 50 can include silicon, a silicon-germanium alloy, germanium, amorphous carbon, silicon oxide, silicon oxynitride, silicon nitride, a dielectric metal oxide, a dielectric metal nitride, a photoresist material, an organic material, an elemental metal, an intermetallic alloy, a metal oxide, a metal nitride, or any other material different from the material of the material layer 20L, the material of the first mandrel structure 30, and the material of the first spacer 40. The height of the second mandrel structure 50 can be, for example, from 12 nm to 1,000 nm, although lesser and greater thicknesses can also be employed. In one embodiment, the height of the second mandrel structure 50 can be greater than the height of the first mandrel structure 30.

In an illustrative example, the first mandrel structure 30 can include one of germanium, a silicon-germanium alloy, and amorphous carbon, and the first spacer 40 can include silicon oxide, silicon nitride, or silicon oxynitride, and the second mandrel structure 50 can include a photoresist material, an organic material, or a silicon germanium alloy (which has a lesser atomic germanium concentration than the atomic germanium concentration of the first mandrel structure 30 if the first mandrel structure 30 includes another silicon germanium alloy).

Referring to FIGS. 3A and 3B, all portions of the first mandrel structure 30 that are not covered by the second mandrel structure 50 can be removed by an anisotropic etch (such as a reactive ion etch) that employs the second mandrel structure 50 as an etch mask. Further, all portions of the first spacer 40 that are not covered by the second mandrel structure 50 can also be removed by the etch. Thus, the physically exposed sidewalls of the remaining portions of the first mandrel structure 30 and the physically exposed sidewalls of the remaining portions of the first spacer 40 are vertically coincident with overlying sidewalls of the second mandrel structure 50. As used herein, a first surface is vertically coincident with a second surface if the first surface and the second surface are located within a same vertical plane. The chemistry of the anisotropic etch that removes the physically exposed portions of the first mandrel structure 30 and the first spacer 40 can be selective to the material of the material layer 20L so that the material of the material layer 20L is not significantly removed by the anisotropic etch.

Referring to FIGS. 4A and 4B, a second spacer 60 is formed around the second mandrel structure 50 and remaining portions of the first mandrel structure 30 and the first spacer 40. The second spacer 60 can be formed by depositing a second spacer material layer (not shown) on the top surface of the material layer 20L, on the top surface of the second mandrel structure 50, and sidewalls of the second mandrel structure 50 and the remaining portions of the first mandrel structure 30 and the first spacer 40, and subsequently removing horizontal portions of the second spacer material layer by an anisotropic etch, such as a reactive ion etch. The remaining vertical portions of the second spacer material layer constitute the second spacer 60.

The second spacer 60 can include a semiconductor material, a dielectric material, or a conductive material, provided that the material of the second spacer 60 is different from the material of the second mandrel structure 50, from the material of the first mandrel structure 30, and from the material of the material layer 20L. In one embodiment, the second spacer 60 can include silicon, a silicon-germanium alloy, germanium, amorphous carbon, silicon oxide, silicon oxynitride, silicon nitride, a dielectric metal oxide, a dielectric metal nitride, a photoresist material, an organic material, an elemental metal, an intermetallic alloy, a metal oxide, a metal nitride, or any other material different from the material of the material layer 20L, from the material of the first mandrel structure 30, and from the material of the second mandrel structure 50. The material of the second spacer 60 can include the same material as, or a material different from, the material of the first spacer 40.

The thickness of the second spacer 60, i.e., the lateral dimension between an inner sidewall of the second spacer 60 and an outer sidewall that is most proximate to the inner sidewall, is not limited by lithographic capabilities of available lithography tools. Thus, the thickness of the second spacer 60 can be a sublithographic dimension, i.e., a dimension that is less than the smallest dimension that can be printed by single lithographic exposure. In one embodiment, the thickness of the second spacer 60 can be from 1 nm to 100 nm, although lesser and greater thicknesses can also be employed.

In an illustrative example, the first mandrel structure 30 can include one of germanium, a silicon-germanium alloy, and amorphous carbon, and the first spacer 40 can include silicon oxide, silicon nitride, or silicon oxynitride, and the second mandrel structure 50 can include a photoresist material, an organic material, or a silicon germanium alloy (which has a lesser atomic germanium concentration than the atomic germanium concentration of the first mandrel structure 30 if the first mandrel structure 30 includes another silicon germanium alloy), and the second spacer 60 can include silicon oxide, silicon nitride, or silicon oxynitride.

Referring to FIGS. 5A and 5B, the remaining portion of the first mandrel structure 30 and the second mandrel structure 50 are removed without removing the first spacer 40, the second spacer 60, and the material layer 20. The removal of the remaining portion of the first mandrel structure 30 and the second mandrel structure 50 selective to the first spacer 40, the second spacer 60, and the material layer 20 can be performed by an etch that is selective to the first spacer 40, the second spacer 60, and the material layer 20. The etch can be an isotropic etch or an anisotropic etch. If the remaining portion of the first mandrel structure 30 and/or the second mandrel structure 50 includes a material that can be removed by combination with oxygen, e.g., amorphous carbon, a photoresist material, or an organic material, the remaining portion of the first mandrel structure 30 and/or the second mandrel structure 50 can be removed by ashing, i.e., controlled combustion at a low pressure environment. The remaining portion of the first mandrel structure 30 and the second mandrel structure 50 can be removed concurrently. All portions of the top surface of the material layer 20L that are not covered by the first spacer 40 and the second spacer 60 are physically exposed.

Referring to FIGS. 6A and 6B, a masking material layer 67 is formed over at least one portion of the first spacer 40 and the second spacer 60. For example, the masking material layer 67 can be a patterned photoresist material layer. In this case, the masking material layer 67 can be formed by applying a blanket photoresist material layer and lithographically patterning the blanket photoresist material layer.

Figure 7B:
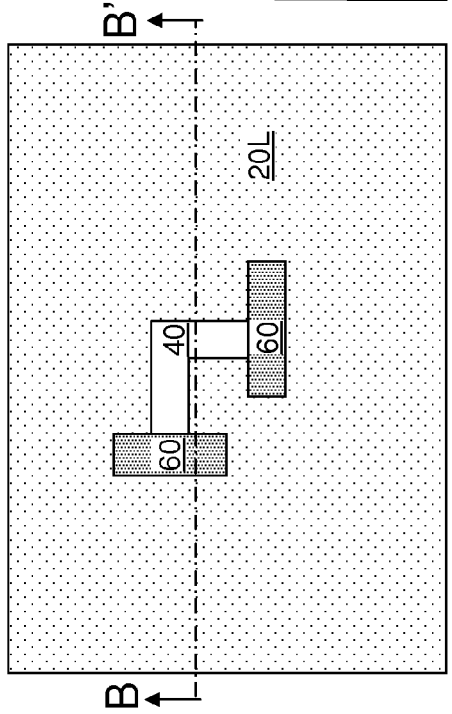
FIG. 7B is a vertical cross-sectional view of the first exemplary structure along the vertical plane B-B' of FIG. 7A.

Referring to FIGS. 7A and 7B, the first spacer 40 and the second spacer 60 can be patterned employing the masking material layer 67 as an etch mask. For example, physically exposed portions of the first spacer 40 and the second spacer 60 can be etched selective to the material layer 20L by an anisotropic etch or an isotropic etch that employs the masking material layer 67 as an etch mask. The masking material layer 67 is subsequently removed selective to the remaining portions of the first spacer 40 and the second spacer 60, for example, by ashing. The combination of the remaining portions of the first spacer 40 and the second spacer 60 provides a pattern as seen in a top-down view, which is herein referred to as a "composite pattern."

Figure 8A:
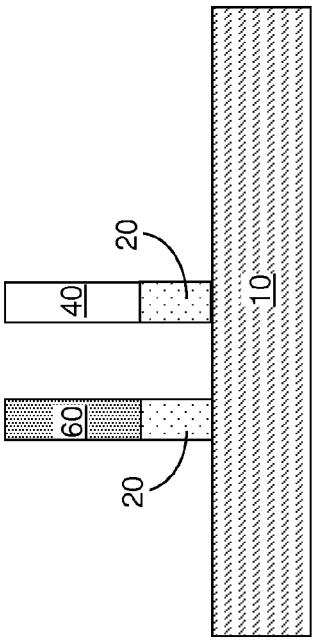
FIG. 8A is a top-down view of the first exemplary structure after transfer of the pattern in remaining portions of the first and second spacers into an underlying material layer according to an embodiment of the present disclosure.
Figure 8B:
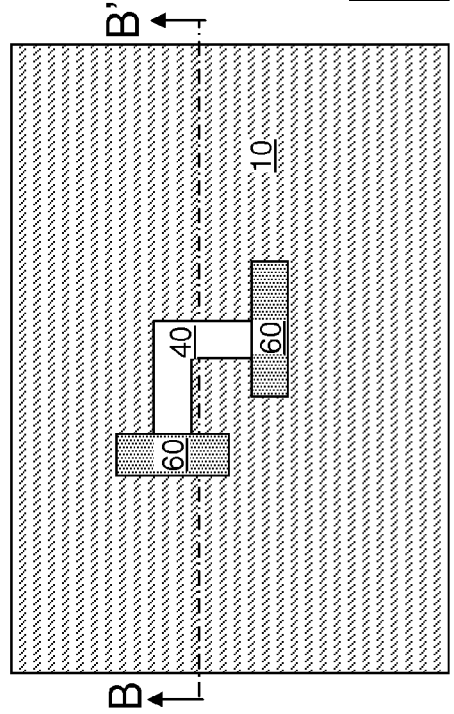
FIG. 8B is a vertical cross-sectional view of the first exemplary structure along the vertical plane B-B' of FIG. 8A.

Referring to FIGS. 8A and 8B, the composite pattern defined by the first spacer 40 and the second spacer 60 is transferred into at least one underlying material layer such as the material layer 20L and optionally into the substrate 10 by an etch, which can be an anisotropic etch. After the transfer of the composite pattern through the material layer 20L by the etch, the remaining portions of the material layer 20L are herein referred to as material portions 20. If an anisotropic etch is employed to transfer the composite pattern into the material layer 20L, the material portions 20 include the composite pattern. In other words, a horizontal cross-sectional area of the material portions 20 has the same shape as the periphery defined by the combination of the first spacer 40 and the second spacer 40 that overlies the material portions 20. Thus, the sidewalls of the material portions 20 are vertically coincident with the sidewalls of the first spacer 40 and the second spacer 60.

The first spacer 40 and the second spacer 60 can be removed selective to the material portions 20 by an etch, which can be an isotropic etch or an anisotropic etch. A non-limiting illustrative example, if the material portions 20 include a semiconductor material or a metallic material and if the first spacer 40 and the second spacer 60 include a dielectric material such as silicon oxide, silicon nitride, and/or silicon oxynitride, the materials of the first spacer 40 and the second spacer 60 can be removed by one or more wet etches for removing dielectric materials selective to the semiconductor material or selective to the metallic material as known in the art.

Referring to FIGS. 9A and 9B, a second exemplary structure according to an embodiment of the present disclosure is derived from the first exemplary structure of FIGS. 2A and 2B by forming a second spacer 60 without removing physically exposed portions of the first mandrel structure 30 or the first spacer 40. In this embodiment, the material of the second mandrel structure 50 can be the same as, or can be different from, the material of the first mandrel structure 30. The material of the second spacer 60 can be the same as, or can be different from, the material of the first spacer 40.

The second spacer 60 is formed while the first spacer 40 is present in regions that are not covered by the second mandrel structure 50. The second spacer 60 surrounds the first mandrel structure 30, the first spacer 40, and the second mandrel structure 50. The second spacer 60 can contact outer sidewalls of the first spacer 40.

Referring to FIGS. 10A and 10B, the first mandrel structure 30 and the second mandrel structure 50 are removed without removing the first spacer 40, the second spacer 60, and the material layer 20. The removal of the first mandrel structure 30 and the second mandrel structure 50 selective to the first spacer 40, the second spacer 60, and the material layer 20 can be performed by an etch that is selective to the first spacer 40, the second spacer 60, and the material layer 20. The etch can be an isotropic etch or an anisotropic etch. If the first mandrel structure 30 and/or the second mandrel structure 50 include a material that can be removed by combination with oxygen, e.g., amorphous carbon, a photoresist material, or an organic material, the first mandrel structure 30 and/or the second mandrel structure 50 include can be removed by ashing, i.e., controlled combustion at a low pressure environment. The first mandrel structure 30 and the second mandrel structure 50 can be removed concurrently. All portions of the top surface of the material layer 20L that are not covered by the first spacer 40 and the second spacer 60 are physically exposed.

The combination of the remaining portions of the first spacer 40 and the second spacer 60 provides a composite pattern, which includes a first sub-pattern having the same width as the first spacer 40, a second sub-pattern having the same width as the second spacer 60, and a third sub-pattern having the width of the sum of the width of the first spacer 40 and the width of the second spacer 60.

Optionally, the processing steps of FIGS. 6A, 6B, 7A, and 7B can be performed to cut portions of the first spacer 40 and/or the second spacer 60 into arbitrary shapes. Features having three different widths can be formed.

Referring to FIGS. 11A and 11B, the composite pattern defined by the first spacer 40 and the second spacer 60 (or any pattern derived therefrom by cutting portions of the first spacer 40 and/or the second spacer 60) is transferred into at least one underlying material layer such as the material layer 20L and optionally into the substrate 10 by an etch, which can be an anisotropic etch. After the transfer of the composite pattern through the material layer 20L by the etch, the remaining portions of the material layer 20L are herein referred to as material portions 20. If an anisotropic etch is employed to transfer the composite pattern into the material layer 20L, the material portions 20 include the composite pattern. In other words, a horizontal cross-sectional area of the material portions 20 has the same shape as the periphery defined by the combination of the first spacer 40 and the second spacer 40 that overlies the material portions 20. Thus, the sidewalls of the material portions 20 are vertically coincident with the sidewalls of the first spacer 40 and the second spacer 60.

The first spacer 40 and the second spacer 60 can be removed selective to the material portions 20 by an etch, which can be an isotropic etch. A non-limiting illustrative example, if the material portions 20 include a semiconductor material or a metallic material and if the first spacer 40 and the second spacer 60 include a dielectric material such as silicon oxide, silicon nitride, and/or silicon oxynitride, the materials of the first spacer 40 and the second spacer 60 can be removed by one or more wet etches for removing dielectric materials selective to the semiconductor material or selective to the metallic material as known in the art.

Referring to FIGS. 12A and 12B, a third exemplary structure according to an embodiment of the present disclosure is derived from the first exemplary structure of FIGS. 2A and 2B by removing the physically exposed portions of the first mandrel structure 30 that are not covered by the second mandrel structure 50 by an etch. A portion of the first mandrel structure 30 is covered with the second mandrel structure 50. Portions of the first mandrel structure 30 that are not covered by the second mandrel structure 50 are removed by the etch, which employs the second mandrel structure 50 as an etch mask. The etch can be an anisotropic etch. The chemistry of the etch is selected such that the physically exposed portions of the first spacer 40 are not removed.

In an illustrative example, the first mandrel structure 30 can include one of germanium, a silicon-germanium alloy, and amorphous carbon, and the first spacer 40 can include silicon oxide, silicon nitride, or silicon oxynitride, and the second mandrel structure 50 can include a photoresist material, an organic material, or a silicon germanium alloy (which has a lesser atomic germanium concentration than the atomic germanium concentration of the first mandrel structure 30 if the first mandrel structure 30 includes another silicon germanium alloy). In this example, the chemistry of the etch can be selected such that the dielectric material of the first spacer is not removed, while physically exposed portions of the first mandrel structure 30 are removed.

Referring to FIGS. 13A and 13B, second spacers 60 are formed by deposition of a second spacer material layer (not shown) and an anisotropic etch that removed horizontal portions of the second spacer material layer. Remaining vertical portions of the second spacer material layer constitute the second spacers 60. The second spacers 60 are formed after the first spacer 40 is removed in regions that are not covered by the second mandrel structure 50. A contiguous portion of the second spacers 60 surrounds the remaining portion of the first mandrel structure 30, the first spacer 40, and the second mandrel structure 50. Another contiguous portion of the second spacers 60 contacts inner sidewalls of the first spacer 40 and sidewalls of the remaining portion of the first mandrel structure 30. Thus, the second spacers 60 can contact outer sidewalls of the first spacer 40 and inner sidewalls of the first spacer 40. The material of the second spacer 60 can be the same as, or can be different from, the material of the first spacer 40.

Figure 14A:
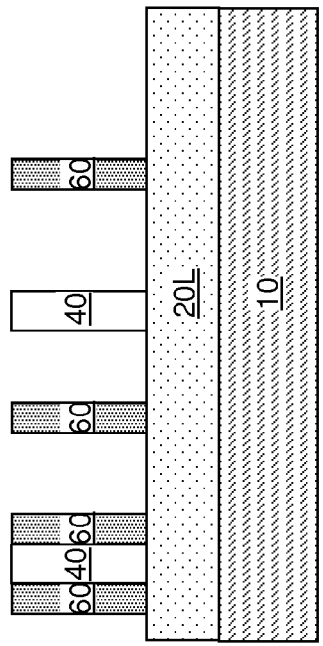
FIG. 14A is a top-down view of the third exemplary structure after removal of the second mandrel structure according to an embodiment of the present disclosure.
Figure 14B:
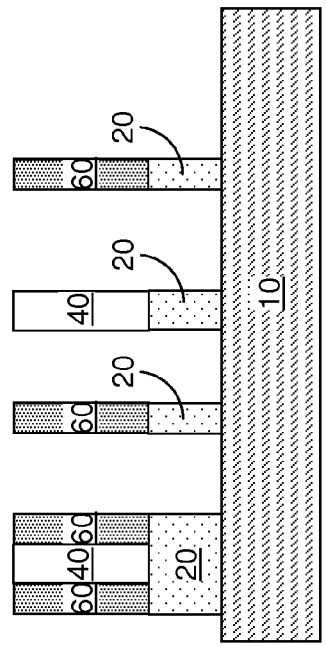
FIG. 14B is a vertical cross-sectional view of the third exemplary structure along the vertical plane B-B' of FIG. 14A.

Referring to FIGS. 14A and 14B, the remaining portion of the first mandrel structure 30 and the second mandrel structure 50 are removed without removing the first spacer 40, the second spacer 60, and the material layer 20. The removal of the remaining portion of the first mandrel structure 30 and the second mandrel structure 50 selective to the first spacer 40, the second spacer 60, and the material layer 20 can be performed by an etch that is selective to the first spacer 40, the second spacer 60, and the material layer 20. The etch can be an isotropic etch or an anisotropic etch. If the first mandrel structure 30 and/or the second mandrel structure 50 include a material that can be removed by combination with oxygen, e.g., amorphous carbon, a photoresist material, or an organic material, the first mandrel structure 30 and/or the second mandrel structure 50 include can be removed by ashing, i.e., controlled combustion at a low pressure environment. The remaining portion of the first mandrel structure 30 and the second mandrel structure 50 can be removed concurrently. All portions of the top surface of the material layer 20L that are not covered by the first spacer 40 and the second spacer 60 are physically exposed.

The combination of the remaining portions of the first spacer 40 and the second spacer 60 provides a composite pattern, which includes a first sub-pattern having the same width as the first spacer 40, a second sub-pattern having the same width as the second spacer 60, and a third sub-pattern having the width of the sum of the width of the first spacer 40 and twice the width of the second spacer 60.

Optionally, the processing steps of FIGS. 6A, 6B, 7A, and 7B can be performed to cut portions of the first spacer 40 and/or the second spacer 60 into arbitrary shapes. Features having three different widths can be formed.

Figure 15A:
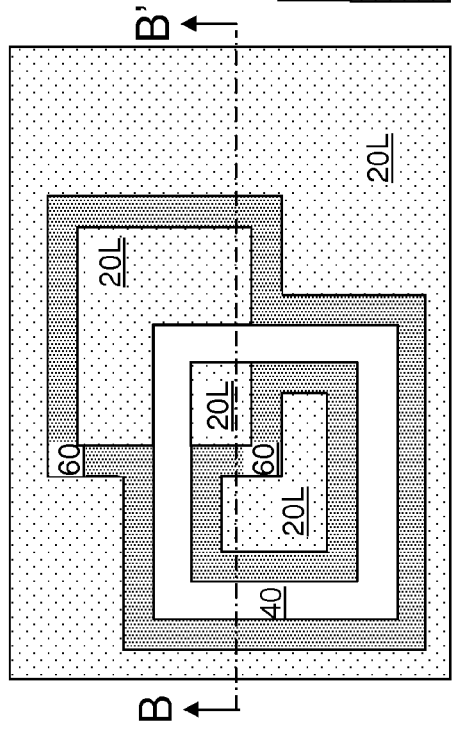
FIG. 15A is a top-down view of the third exemplary structure after transfer of the pattern in remaining portions of the first and second spacers into an underlying material layer according to an embodiment of the present disclosure.
Figure 15B:
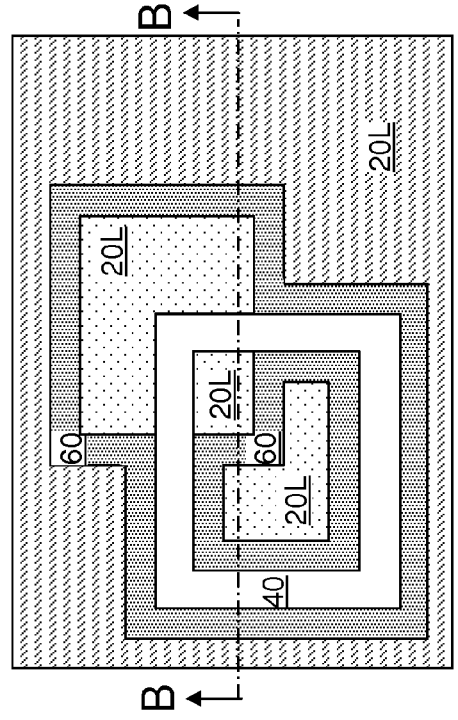
FIG. 15B is a vertical cross-sectional view of the third exemplary structure along the vertical plane B-B' of FIG. 15A.

Referring to FIGS. 15A and 15B, the composite pattern defined by the first spacer 40 and the second spacer 60 (or any pattern derived therefrom by cutting portions of the first spacer 40 and/or the second spacer 60) is transferred into at least one underlying material layer such as the material layer 20L and optionally into the substrate 10 by an etch, which can be an anisotropic etch. After the transfer of the composite pattern through the material layer 20L by the etch, the remaining portions of the material layer 20L are herein referred to as material portions 20. If an anisotropic etch is employed to transfer the composite pattern into the material layer 20L, the material portions 20 include the composite pattern. In other words, a horizontal cross-sectional area of the material portions 20 has the same shape as the periphery defined by the combination of the first spacer 40 and the second spacer 40 that overlies the material portions 20. Thus, the sidewalls of the material portions 20 are vertically coincident with the sidewalls of the first spacer 40 and the second spacer 60.

The first spacer 40 and the second spacer 60 can be removed selective to the material portions 20 by an etch, which can be an isotropic etch or an anisotropic etch. A non-limiting illustrative example, if the material portions 20 include a semiconductor material or a metallic material and if the first spacer 40 and the second spacer 60 include a dielectric material such as silicon oxide, silicon nitride, and/or silicon oxynitride, the materials of the first spacer 40 and the second spacer 60 can be removed by one or more wet etches for removing dielectric materials selective to the semiconductor material or selective to the metallic material as known in the art.

Referring to FIGS. 16A and 16B, a fourth exemplary structure can be the same as the first exemplary structure of FIGS. 7A and 7B, or can be derived by patterning the second exemplary structure of FIGS. 10A and 10B or the third exemplary structure of FIGS. 14A and 14B, for example, employing a masking material layer and an etch.

Referring to FIGS. 17A and 17B, a masking material layer 77 can be formed over the material layer 20L such that the masking material layer 77 covers a portion of the first spacer 40 and a portion of the second spacer 60, while physically exposing another portion of the first spacer 40 and another portion of the second spacer 60. In one embodiment, the masking material layer 77 can be a lithographically patterned photoresist layer. In another embodiment, the masking material layer 77 can be a patterned hard mask layer including a dielectric material, an organic material, a semiconductor material, or a metallic material. The material of the patterned hard mask layer is different from the materials of the first spacer 40 and the second spacer 60. The patterned hard mask layer can be formed, for example, by depositing a blanket hard mask layer, by applying and patterning a photoresist layer thereupon, and by transferring the pattern in the photoresist layer into the blanket hard mask layer by an etch.

Figure 18A:
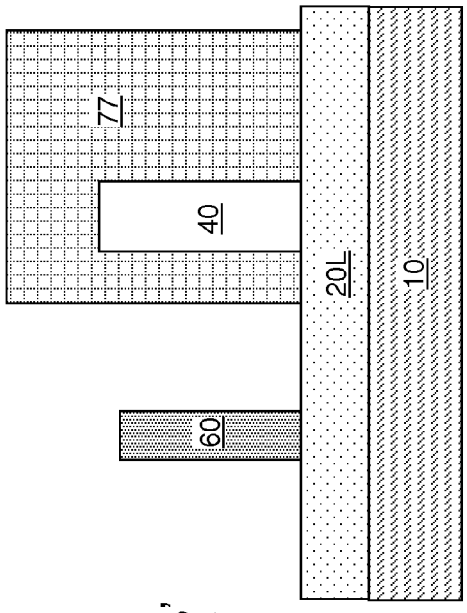
FIG. 18A is a top-down view of the fourth exemplary structure after etching physically exposed portions of the first spacer and the second spacer according to an embodiment of the present disclosure.
Figure 18B:
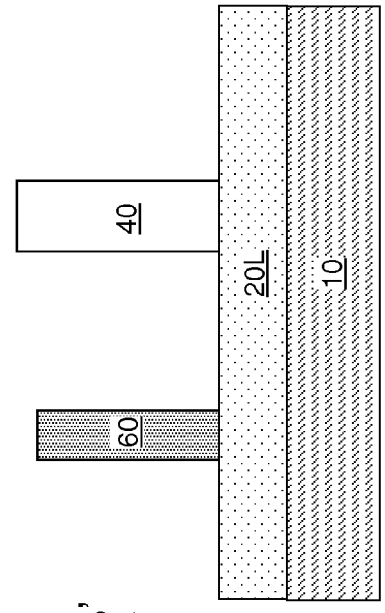
FIG. 18B is a vertical cross-sectional view of the fourth exemplary structure along the vertical plane B-B' of FIG. 18A.

Referring to FIGS. 18A and 18B, physically exposed portions of the first spacer 40 and the second spacer 60 are etched by at least one etch process, while the masked portion of the first spacer 40 and the masked portion of the second spacers 60 are protected by the masking material layer 77, and consequently, are not etched. The at least on etch process can be, for example, at lease one isotropic etch or an etch including a substantially isotropic etch component.

In one embodiment, the physically exposed portion of the first spacer 40 can be etched at a greater etch rate than the physically exposed portion of the second spacer 60 during the etching of the physically exposed portions of the first and second spacers (40, 60).

In another embodiment, the physically exposed portion of the second spacer 60 can be etched at a greater etch rate than the physically exposed portion of the first spacer 40 during the etching of the physically exposed portions of the first and second spacers (40, 60).

Figure 19A:
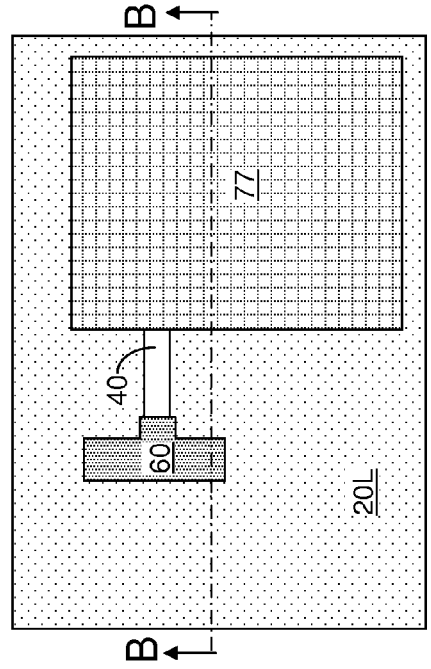
FIG. 19A is a top-down view of the fourth exemplary structure after removal of the masking material layer according to an embodiment of the present disclosure.
Figure 19B:
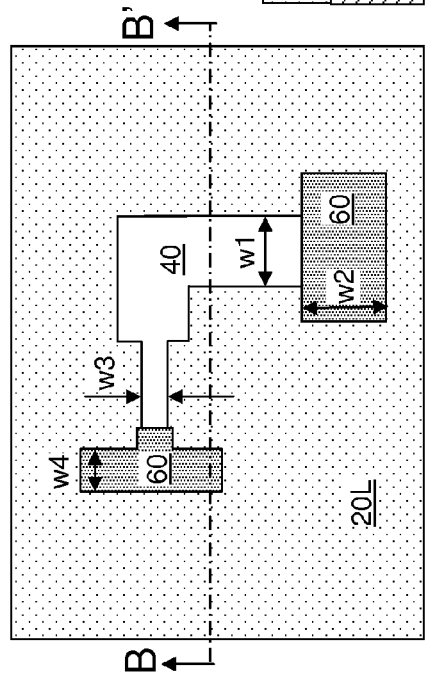
FIG. 19B is a vertical cross-sectional view of the fourth exemplary structure along the vertical plane B-B' of FIG. 19A.

Referring to FIGS. 19A and 19B, the masking material layer 77 is removed selective to the first spacer 40, the second spacer 60, and the material layer 20L. The composite pattern defined by the combination of the first spacer 40 and the second spacer 60 can include four different widths, which can include a first width w1 for unetched portions of the first spacer 40, a second width w2 of unetched portions of the second spacer 60, a third width w3 for the etched portion(s) of the first spacer 40, and a fourth width w4 for the etched portion(s) of the second spacer 60.

Referring to FIGS. 20A and 20B, the composite pattern defined by the first spacer 40 and the second spacer 60 is transferred into at least one underlying material layer such as the material layer 20L and optionally into the substrate 10 by an etch, which can be an anisotropic etch. After the transfer of the composite pattern through the material layer 20L by the etch, the remaining portions of the material layer 20L are herein referred to as material portions 20. If an anisotropic etch is employed to transfer the composite pattern into the material layer 20L, the material portions 20 include the composite pattern. In other words, a horizontal cross-sectional area of the material portions 20 has the same shape as the periphery defined by the combination of the first spacer 40 and the second spacer 40 that overlies the material portions 20. Thus, the sidewalls of the material portions 20 are vertically coincident with the sidewalls of the first spacer 40 and the second spacer 60.

The first spacer 40 and the second spacer 60 can be removed selective to the material portions 20 by an etch, which can be an isotropic etch or an anisotropic etch. A non-limiting illustrative example, if the material portions 20 include a semiconductor material or a metallic material and if the first spacer 40 and the second spacer 60 include a dielectric material such as silicon oxide, silicon nitride, and/or silicon oxynitride, the materials of the first spacer 40 and the second spacer 60 can be removed by one or more wet etches for removing dielectric materials selective to the semiconductor material or selective to the metallic material as known in the art.

Referring to FIGS. 21A and 21B, a fifth exemplary structure according to an embodiment of the present disclosure can be derived from the fourth exemplary structure of FIGS. 17A and 17B by selectively depositing a material on one of the first spacer 40 and the second spacer 60, while not depositing the material on the other of the first spacer 40 and the second spacer 60 or on the top surface of the material layer 20L. In this embodiment, the first spacer 40 and the second spacer 60 include different materials. Any known method for depositing a material on one type of surface selective to other types of surfaces can be employed. The deposited material can be, for example, a dielectric material such as silicon oxide or a semiconductor material such as silicon or a silicon germanium alloy.

The material can be deposited on at least one physically exposed portion of the first and second spacers (40, 60) while no material is deposited on the masked portions of the first and second spacers (40, 60). In one embodiment, the selective deposition of the material can be performed such that the material is deposited on a physically exposed portion of the first spacer 40, while the material does not nucleate on a physically exposed portion of the second spacer 60 or the top surface of the material layer 20L. In another embodiment, the selective deposition of the material can be performed such that the material is deposited on a physically exposed portion of the second spacer 60, while the material does not nucleate on a physically exposed portion of the first spacer 40 or the top surface of the material layer 20L.

Referring to FIGS. 22A and 22B, the composite pattern defined by the first spacer 40 and the second spacer 60 is transferred into at least one underlying material layer such as the material layer 20L and optionally into the substrate 10 by an etch, which can be an anisotropic etch. The remaining portions of the material layer 20L after the transfer of the composite pattern through the material layer 20L by the etch are herein referred to as material portions 20. If an anisotropic etch is employed to transfer the composite pattern into the material layer 20L, the material portions 20 include the composite pattern. In other words, a horizontal cross-sectional area of the material portions 20 has the same shape as the periphery defined by the combination of the first spacer 40 and the second spacer 40 that overlies the material portions 20. Thus, the sidewalls of the material portions 20 are vertically coincident with the sidewalls of the first spacer 40 and the second spacer 60.

The first spacer 40 and the second spacer 60 can be removed selective to the material portions 20 by an etch, which can be an isotropic etch or an anisotropic etch. A non-limiting illustrative example, if the material portions 20 include a semiconductor material or a metallic material and if the first spacer 40 and the second spacer 60 include a dielectric material such as silicon oxide, silicon nitride, and/or silicon oxynitride, the materials of the first spacer 40 and the second spacer 60 can be removed by one or more wet etches for removing dielectric materials selective to the semiconductor material or selective to the metallic material as known in the art.

Referring to FIGS. 23A and 23B, a sixth exemplary structure can be the same as the first exemplary structure of FIGS. 1A and 1B.

Referring to FIGS. 24A and 24B, a matrix layer 30L is formed above the top surface of the material layer 20L and around the assembly of the first mandrel structure 30 and the first spacer 40. As used herein, a "matrix layer" refers to a contiguous layer embedding at least one heterogeneous material therein. The matrix layer 30L fills a complementary region that is not occupied by the first mandrel structure 30 and the first spacer 40 over the material layer 20L. The matrix layer 30L complementarily fills the entire space above the underlying material layer 20L up to the top surface of the first spacer 40. The matrix layer 30L can include the same material as the first mandrel structure 30. Alternately, the matrix layer 30L can include a same type of material as the first mandrel structure 30 provided that the material of the matrix layer 30L can be removed simultaneously with the removal of the materials of the first mandrel structure 30 and a second mandrel structure in a subsequent etch step.

In one embodiment, the matrix layer 30L can be planarized by employing a self-planarizing material applied by a spin-on coating process, and/or by other planarization processes such as chemical mechanical planarization. The matrix layer 30L embeds the first mandrel structure 30 and the first spacer 40. In one embodiment, the top surface of the matrix layer 30L can be coplanar with the top surface of the first mandrel structure 30 and the top surface of the first spacer 40. Optionally, an etch stop material layer (not shown) may be formed over the matrix layer 30L and the first spacer 40 so that a pattern subsequently formed above the top surface of the matrix layer 30L and the first spacer 40 is not transferred below the top surface of the matrix layer 30L and the first spacer 40.

Referring to FIGS. 25A and 25B, a second mandrel structure 50 is formed over the top surfaces of the matrix layer 30L, the first mandrel structure 30, and the first spacer 40. The second mandrel structure straddles a portion of the first mandrel structure 30 and a portion of the first spacer 40. The etch stop material layer, if present, can prevent collateral patterning of the matrix layer 30L and the first spacer 40.

Referring to FIGS. 26A and 26B, a second spacer 60 is formed around the second mandrel structure by deposition of a second spacer material layer and by an anisotropic etch that removes horizontal portions of the second spacer material layer. The remaining vertical portions of the second spacer material layer constitute the second spacer 60. In one embodiment, the second spacer 60 may straddle the first spacer 40. The second spacer 60 is formed while the first spacer 40 is present in regions that are not covered by the second mandrel structure 50.

Referring to FIGS. 27A and 27B, physically exposed portions of the first mandrel structure 30 and the matrix layer 30L are removed selective to the materials of the second spacer 60 and the first spacer 40 by an anisotropic etch The entirety of the second mandrel structure 50 and physically exposed portions of the first mandrel structure 30 and the matrix layer 30L that are not covered the second spacer 60 are removed during the anisotropic etch that employs the second spacer 60 as an etch mask.

A remaining portion of the first mandrel structure 30 and a portion of the matrix layer 30L that are underlie the second spacer 60 is formed after the anisotropic etch. The remaining portion of the first mandrel structure 30 and the portion of the matrix layer 30L are herein referred to as residual material portions 32.

Referring to FIGS. 28A and 28B, the composite pattern defined by the first spacer 40 and the second spacer 60 is transferred into at least one underlying material layer such as the material layer 20L and optionally into the substrate 10 by an etch, which can be an anisotropic etch. After the transfer of the composite pattern through the material layer 20L by the etch, the remaining portions of the material layer 20L are herein referred to as material portions 20. If an anisotropic etch is employed to transfer the composite pattern into the material layer 20L, the material portions 20 include the composite pattern. In other words, a horizontal cross-sectional area of the material portions 20 has the same shape as the periphery defined by the combination of the first spacer 40 and the second spacer 40 that overlies the material portions 20. Thus, the sidewalls of the material portions 20 are vertically coincident with the sidewalls of the first spacer 40 and the second spacer 60.

The first spacer 40 and the second spacer 60 can be removed selective to the material portions 20 by an etch, which can be an isotropic etch or an anisotropic etch. A non-limiting illustrative example, if the material portions 20 include a semiconductor material or a metallic material and if the first spacer 40 and the second spacer 60 include a dielectric material such as silicon oxide, silicon nitride, and/or silicon oxynitride, the materials of the first spacer 40 and the second spacer 60 can be removed by one or more wet etches for removing dielectric materials selective to the semiconductor material or selective to the metallic material as known in the art.

The various embodiments of the present disclosure enable formation of structures having sublithographic dimensions because dimensions of the spacers are not limited by lithographic methods. Further, structures having multiple widths can be provided by the composite pattern, which can be transferred into underlying layers to provide conductive, semiconducting, or insulating structures having dimensions not limited by lithographic methods.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a patterned structure comprising:
    forming a first mandrel structure on a top surface of a material layer;
    forming a first spacer around said first mandrel structure;
    forming a second mandrel structure that straddles a portion of said first spacer;
    forming a second spacer around the second mandrel structure, wherein said second spacer is formed while said first mandrel structure is present in regions that are not covered by said second mandrel structure; and
    transferring a composite pattern of at least one portion of said first spacer and at least one portion of said second spacer into said material layer by an etch.

2. The method of claim 1, further comprising removing all portions of said first mandrel structure that are not covered by said second mandrel structure prior to forming said second spacer.

3. The method of claim 2, further comprising removing portions of said first spacer that are not covered by said second mandrel structure prior to forming said second spacer.

4. The method of claim 2, wherein said second spacer is formed while said first spacer is present in regions that are not covered by said second mandrel structure.

5. The method of claim 1, further comprising removing said first mandrel structure and said second mandrel structure prior to said transferring of said composite pattern into said material layer.

6. The method of claim 5, further comprising concurrently removing said first mandrel structure and said second mandrel structure.

7. The method of claim 5, further comprising:
covering a portion of said first mandrel structure with said second mandrel structure; and
removing portions of said first mandrel structure that are not covered by said second mandrel structure by an etch employing said second mandrel structure as an etch mask.

8. The method of claim 1, wherein said first mandrel structure and said second mandrel structures are formed directly on said top surface of said material layer.

9. A method of forming a patterned structure comprising:
forming a first mandrel structure on a top surface of a material layer;
forming a first spacer around said first mandrel structure;
forming a second mandrel structure that straddles a portion of said first spacer;
forming a second spacer around the second mandrel structure;
transferring a composite pattern of at least one portion of said first spacer and at least one portion of said second spacer into said material layer by an etch;
masking one or more portions of said first and second spacers with a masking material layer, while physically exposing a rest of said first and second spacers; and
etching at least one physically exposed portion of said first and second spacers while said masked one or more portions of said first and second spacers are not etched.

10. The method of claim 9, wherein said etching of said at least one physically exposed portion of said first and second spacers comprises etching a physically exposed portion of said first spacer at a greater etch rate than a physically exposed portion of said second spacer.

11. The method of claim 9, wherein said etching of said at least one physically exposed portion of said first and second spacers comprises etching a physically exposed portion of said second spacer at a greater etch rate than a physically exposed portion of said first spacer.

12. A method of forming a patterned structure comprising:
forming a first mandrel structure on a top surface of a material layer;
forming a first spacer around said first mandrel structure;
forming a second mandrel structure that straddles a portion of said first spacer;
forming a second spacer around the second mandrel structure;
transferring a composite pattern of at least one portion of said first spacer and at least one portion of said second spacer into said material layer by an etch;
masking one or more portions of said first and second spacers with a masking material layer, while physically exposing a rest of said first and second spacers; and
selectively depositing a material on at least one physically exposed portion of said first and second spacers while no material is deposited on said masked one or more portions of said first and second spacers.

13. The method of claim 12, wherein said selectively depositing of said material comprises depositing said material on a physically exposed portion of said first spacer while said material does not nucleate on a physically exposed portion of said second spacer.

14. The method of claim 12, wherein said selectively depositing of said material comprises depositing said material on a physically exposed portion of said second spacer while said material does not nucleate on a physically exposed portion of said first spacer.

15. A method of forming a patterned structure comprising:
forming a first mandrel structure on a top surface of a material layer;
forming a first spacer around said first mandrel structure;
forming a second mandrel structure that straddles a portion of said first spacer;
forming a second spacer around the second mandrel structure;
transferring a composite pattern of at least one portion of said first spacer and at least one portion of said second spacer into said material layer by an etch;
forming a matrix layer that fills a complementary region that is not occupied by said first mandrel structure and said first spacer over said material layer;
planarizing said matrix layer employing said first spacer, wherein said matrix layer embeds said first mandrel structure and said first spacer, and said second mandrel structure and said second spacer are formed on a top surface of said matrix layer.

16. The method of claim 15, further comprising removing said first mandrel structure and said matrix layer employing said second spacer as an etch mask.

17. The method of claim 16, further comprising removing said second mandrel structure employing said second spacer as an etch mask.

18. The method of claim 16, further comprising transferring a pattern in said second spacer into a layer including said first mandrel structure, said first spacer, and said matrix layer.

19. The method of claim 18, wherein a portion of said first mandrel structure and a portion of said matrix layer underlies said second spacer.

* * * * *